United States Patent
Bilgili

(10) Patent No.: US 10,217,269 B1
(45) Date of Patent: Feb. 26, 2019

(54) COMPRESSIVE SENSING OF LIGHT TRANSPORT MATRIX

(71) Applicant: Siemens Healthcare GmbH, Erlangen (DE)

(72) Inventor: Ahmet Bilgili, Princeton, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/825,510

(22) Filed: Nov. 29, 2017

(51) Int. Cl.
| | |
|---|---|
| *G06T 15/08* | (2011.01) |
| *G06T 15/50* | (2011.01) |
| *G06T 7/136* | (2017.01) |
| *G06T 1/00* | (2006.01) |
| *G06T 1/20* | (2006.01) |

(52) U.S. Cl.
CPC ............ *G06T 15/08* (2013.01); *G06T 1/0007* (2013.01); *G06T 1/20* (2013.01); *G06T 7/136* (2017.01); *G06T 15/506* (2013.01); *G06T 2207/10028* (2013.01); *G06T 2207/20* (2013.01)

(58) Field of Classification Search
None
See application file for complete search history.

(56) References Cited

U.S. PATENT DOCUMENTS

| | | | | |
|---|---|---|---|---|
| 8,780,112 B2* | 7/2014 | Kontkanen | ............... | G06T 1/60 345/426 |
| 2003/0179197 A1* | 9/2003 | Sloan | .................... | G06T 15/506 345/426 |
| 2006/0279570 A1* | 12/2006 | Zhou | ....................... | G06T 15/60 345/426 |

OTHER PUBLICATIONS

Alexander Keller, Leonhard Grunschloß, Marc Droske, "Quasi-Monte Carlo Progressive Photon Mapping", 2010, Springer, Monte Carlo and Quasi-Monte Carlo Methods 2010. Springer Proceedings in Mathematics & Statistics, vol. 23.*

Joel Kronander, Daniel Jonsson, Joakim Low, Patric Ljung, Anders Ynnerman, Jonas Unger, "Efficient Visibility Encoding for Dynamic Illumination in Direct Volume Rendering", Mar. 2012, IEEE, IEEE Transactions on Visualization and Computer Graphics, vol. 18, No. 3, pp. 447-462.*

M. Ruiz, I. Boada, I. Viola, S. Bruckner, M. Feixas, and M. Sbert, "Obscurance-based Volume Rendering Framework", Aug. 11, 2008, Eurographics Association, SPBG'08 Proceedings of the Fifth Eurographics / IEEE VGTC conference on Point-Based Graphics, pp. 113-120.*

Dzung L. Pham, Chenyang Xu, and Jerry L. Prince, "Current Methods in Medical Image Segmentation", Aug. 2000, Annual Review of Biomedical Engineering, vol. 2:315-337.*

(Continued)

*Primary Examiner* — Robert Bader

(57) ABSTRACT

A computer-implemented method for performing compressive sensing of light transport matrix includes receiving a 3D dataset comprising image volume data and randomly selecting a plurality of points on a space curve traversing the 3D dataset. A light transport matrix comprising a plurality of light transmittance values is calculated. Each light transmittance value corresponds to light transmittance between a pair of points included in the plurality of points. An optimization problem is solved to determine a plurality of sparse coefficients which reproduce the light transport matrix when the sparse coefficients are multiplied by a predetermined dictionary of basis vectors. Once determined, the sparse coefficients are stored on a computer-readable medium.

17 Claims, 3 Drawing Sheets

(56) References Cited

OTHER PUBLICATIONS

Peter-Pike Sloan, Jan Kautz, John Snyder, "Precomputed Radiance Transfer for Real-Time Rendering in Dynamic, Low-Frequency Lighting Environments", Jul. 26, 2002, ACM, Proceeding SIGGRAPH '02 Proceedings of the 29th annual conference on Computer graphics and interactive techniques, pp. 527-536.*

Liu, Xiaoyang et al. "Compressive volume rendering." Computer Graphics Forum. vol. 34. No. 3. 2015.

Huang, et al. "Sparsely Precomputing the Light Transport Matrix for Real-Time Rendering." Computer Graphics Forum. vol. 29. No. 4. Blackwell Publishing Ltd, 2010.

* cited by examiner

COMPRESSIVE SENSING OF LIGHT TRANSPORT MATRIX

TECHNOLOGY FIELD

The present invention relates generally to methods, systems, and apparatuses for using compressive sensing techniques in the calculation of a light transport matrix. The technology described herein may be applied, for example, to 3D medical imaging applications.

BACKGROUND

Generating visibly and physically plausible images is an important task for the users to get more in-depth understanding of the data. In order for computers to generate such images, light material interactions have to be considered. Those interactions are computed through the mathematical and physical foundations set by the light transport algorithms. Because it is not possible to compute all the interactions, different mathematical approaches are used by conventional technologies.

One popular approach for computing light interactions is the use of Monte Carlo (MC) statistical methods. Complicated phenomena can be computed with MC methods but the artifacts of these algorithms appear as noise in the resulting images. The square of number of samples in the algorithm can only improve the results linearly and that costs as computation time.

MC statistical methods explore the space using statistical light transport events and directions. These directions are not known ahead and, generally, the directions are selected according to the events. The energy carrying paths providing the most contributions aids in faster convergence of the resulting image to a non-noisy image. If these paths were known ahead of time, the points which contribute most can be addressed easily and noise free images can be acquired. The problem is to represent those paths because each path is a function of begin, end points, the scattering functions on each end and the visibility value between those two ends. This problem can be simplified if the scattering functions are chosen as isotropic scattering functions. The problem then can be represented as a matrix of points and the visibility between those points. This matrix is referred to herein as the light transport matrix.

The light transport matrix is a very large matrix; its size is defined by all possible combinations of points and their relations. This large size makes tasks such as processing and storage unwieldy from a computation perspective. This limits the ability to efficiently utilize the light transport matrix in applications such as medical imaging applications. Accordingly, it is desired to provide techniques for light transport matrix computation that result in a reduced overall size of the matrix without losing the fidelity (and, thus, usefulness) of the data in the matrix.

SUMMARY

Embodiments of the present invention address and overcome one or more of the above shortcomings and drawbacks, by providing methods, systems, and apparatuses related to using compressive sensing of a light transport matrix. The techniques described above provide noise-free rendering in a shorter time compared to conventional light transport matrix calculation techniques.

According to some embodiments, a computer-implemented method for performing compressive sensing of light transport matrix includes receiving a 3D dataset comprising image volume data and randomly selecting a plurality of points on a space curve traversing the 3D dataset. A light transport matrix comprising a plurality of light transmittance values is calculated. Each light transmittance value corresponds to light transmittance between a pair of points included in the plurality of points. An optimization problem is solved to determine a plurality of sparse coefficients which reproduce the light transport matrix when the sparse coefficients are multiplied by a predetermined dictionary of basis vectors. In some embodiments, the optimization problem is solved by performing a plurality of mathematical operations in parallel using a plurality of graphical processing units. Once determined, the sparse coefficients are stored on a computer-readable medium.

In some embodiments, the aforementioned method further includes receiving a request to display the image volume data with illumination and retrieving the sparse coefficients from the computer-readable medium. The light transport matrix is reconstructed using the sparse coefficients and the predetermined dictionary of basis vectors. Then, the image volume data may be displayed with illumination using the light transport matrix.

In some embodiments of the aforementioned method, the space curve preserves locality of values in the 3D dataset. For example, the space curve may be a Hilbert space-filling curve or a plurality of Z-order curve iterations.

In some embodiments, the image volume data comprises anatomical objects and calculation of the light transport matrix is performed by identifying anatomical features between each pair of points included in the randomly selected plurality of points on the space curve and determining light attenuation values for each of the anatomical features. Then, the light transport matrix may be populated only with light transmittance values for pairs of points not separated by one or more anatomical features having light attenuation values above a predetermined threshold value. In some embodiments, the anatomical features are identified by applying a trained machine learning model to the 3D dataset. In other embodiments, the anatomical features are identified by applying an image mask that masks voxels of the image volume data corresponding to the one or more anatomical features having light attenuation values above the predetermined threshold value.

According to other embodiments, an article of manufacture for performing compressive sensing of light transport matrix comprises a computer-readable, non-transitory medium holding computer-executable instructions for performing the method discussed above. The computer-readable, non-transitory medium may include additional instructions for performing the various modifications of the method discussed above.

According to other embodiments, a system for performing compressive sensing of light transport matrix includes an image acquisition device, a parallel processing memory architecture, and a computer readable medium. The image acquisition device is configured to acquire a 3D dataset comprising image volume data. The parallel processing memory architecture comprises a plurality of processors configured to randomly select a plurality of points on a space curve traversing the 3D dataset, and calculate a light transport matrix comprising a plurality of light transmittance values. Each light transmittance value corresponds to light transmittance between a pair of points included in the plurality of points. The processors are further configured to solve an optimization problem to determine a plurality of sparse coefficients which reproduce the light transport matrix when the sparse coefficients are multiplied by a predetermined dictionary of basis vectors. The computer-readable medium is configured to store the sparse coefficients.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the cardiac motion assessment technique, there is shown in the drawings embodiments that are presently preferred, it being understood, however, that the cardiac motion assessment technique is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to the compressive sensing (CS) of a light transport matrix. The light transport matrix is a very large matrix. Its size is defined by all possible combinations of points and their relations. But with the help of CS and, in some embodiments, other fundamental observations in rendering (i.e. visibility between points drops rapidly, sparsity of the visibility signal frequency), the size of the matrix can be reduced considerably. Therefore the light transport matrix can be reconstructed from a subtle amount of samples using CS. After the re-construction of this matrix any given two point and their visibility to each other can be known ahead. Thus, there would not be need of exploring the space. Only the large contributing samples can be detected without exploration and non-noisy images can be generated.

Figure 1:
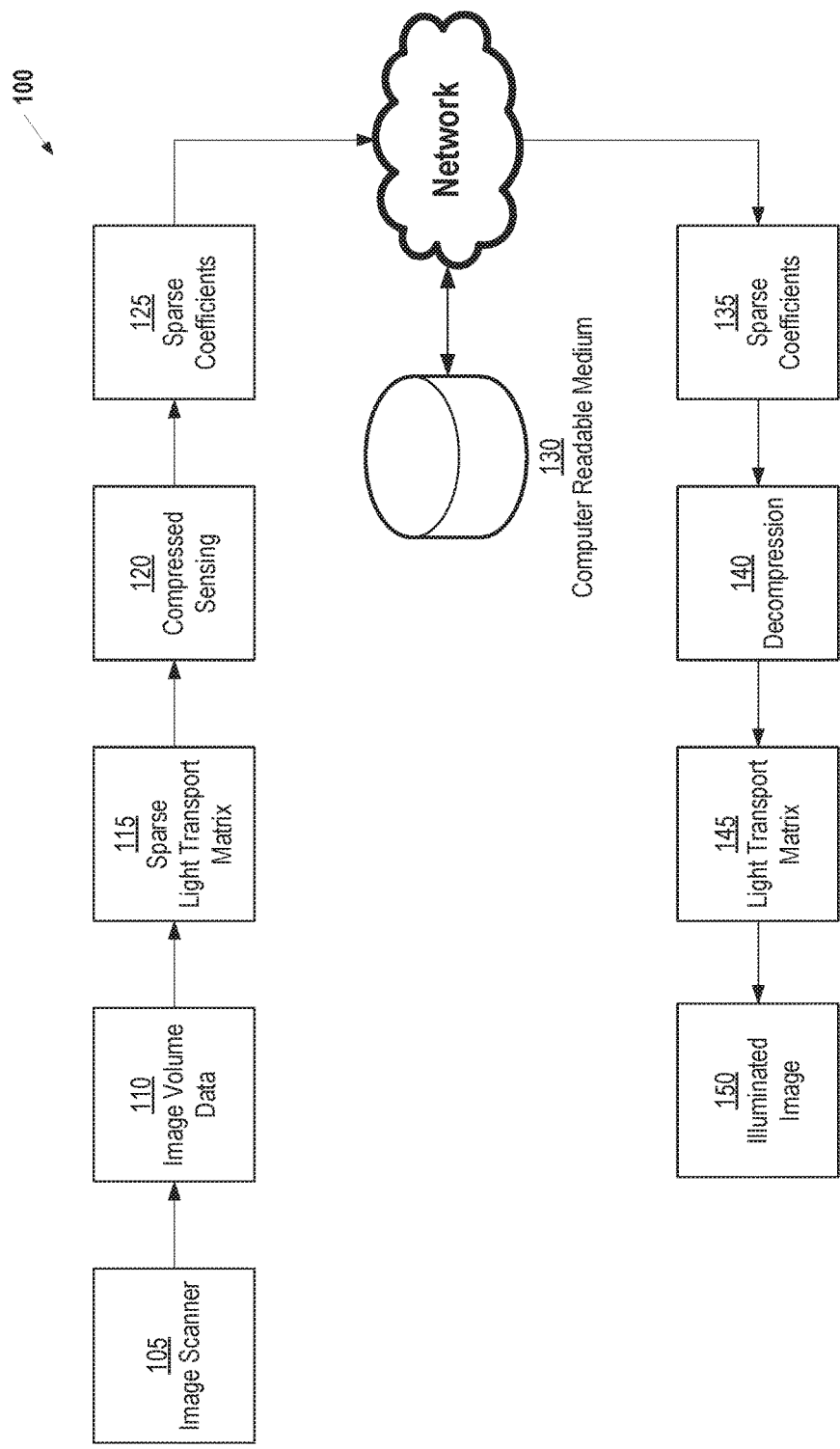
FIG. 1 provides an illustration of the general framework for compressing a light transport matrix, according to some embodiments.

FIG. 1 provides an illustration of the general framework 100 for compressing a light transport matrix, according to some embodiments. To illustrate the complexity of the light transport matrix calculation, this example is a typical use case of the volume rendering and volume rendering method is being widely used in many medical imaging products. An image scanner 105 (e.g., magnetic resonance scanner or computed tomography scanner) is used to acquire image volume data 110 using techniques generally known in the art. To produce an image with illumination, the image volume data 110 must be rendered with a light transport matrix. If a $256^3$ voxel volume is to be rendered, the number of paths that has to be explored can be shown with matrix of $(256^3)\times(256^3)$. Because the visibility between any given two points is the same, the size of the problem can only be reduced to half. However, even with this reduction, the size of the matrix would still be unmanageable in terms of storage and computation.

Rather than calculate and store the entire light transport matrix, the techniques described herein calculate a sparse light transport matrix 115 that is reduced in size compared to the complete matrix that is used in conventional light transport calculations. There are two main observations that can reduce the size of the matrix rapidly. The first observation is the visibility between two given points depends on the spatial relations and the transfer functions. If two points are far enough, generally the visibility between them will be zero. This observation will result in a band light transport matrix if volume is flattened using spatial space curves. If we assume that 4-5 voxels away the visibility drops to zero, for each voxel only $5^3$ voxels will be important and the rest would be unimportant. The band size of the matrix would be $(256^3)\times(5^3)$. The second observation is that the visibility signal would be a sparse signal because of the smooth volume properties. This would mean that with 5-10 random percent of the point tuples the signal can be reconstructed using compressive sensing methods. As a result of this light transport matrix, it would be represented as a sparse matrix and can fit into the GPU memory (see FIG. 3). If 10 percent of the signal is considered the light transport matrix, representation will hold approximately $(256^3)\times10$ values. If the visibility is discretized to 8 bits, the light transport matrix will hold 166 MB+indexes (because of the sparse matrix representation).

Continuing with reference to FIG. 1, one or more CS 120 techniques are applied to the sparse light transport matrix 115 to generate sparse coefficients 125 which reproduce the complete light transport matrix when the sparse coefficients 125 are multiplied by a predetermined dictionary of basis vectors. The CS 120 is further detailed below with respect to FIG. 1. Once the sparse coefficients 125 are determined, they may be stored either locally or remotely on a computer readable medium.

To illustrate an example of the utility of the technology described herein, FIG. 1 shows the sparse coefficients 125 being transferred over a network to a remote computer readable medium 130 (e.g., located on a server in a cloud-based environment). Once stored, a computer can retrieve a copy of the sparse coefficients 135 from the remote computer readable medium 130 (the sparse coefficients 135 are a copy of the sparse coefficients 125). A decompression process 140 may then be performed by applying the copy of the sparse coefficients 135 to the predetermined dictionary of basis vectors to reproduce either the individual elements of the light transport matrix or the complete light transport matrix 145. It should be noted that the decompression process 140 does not need to decompress all of the matrix. Rather, by using the related base function coefficients, a single value i,j may be computed which indicates a dot product of two vectors. Following decompression, the light transport matrix 145 may then be applied to the Image Volume Data 110 (either stored locally or retrieved from a remote source) to create an illuminated image 150.

Figure 2:
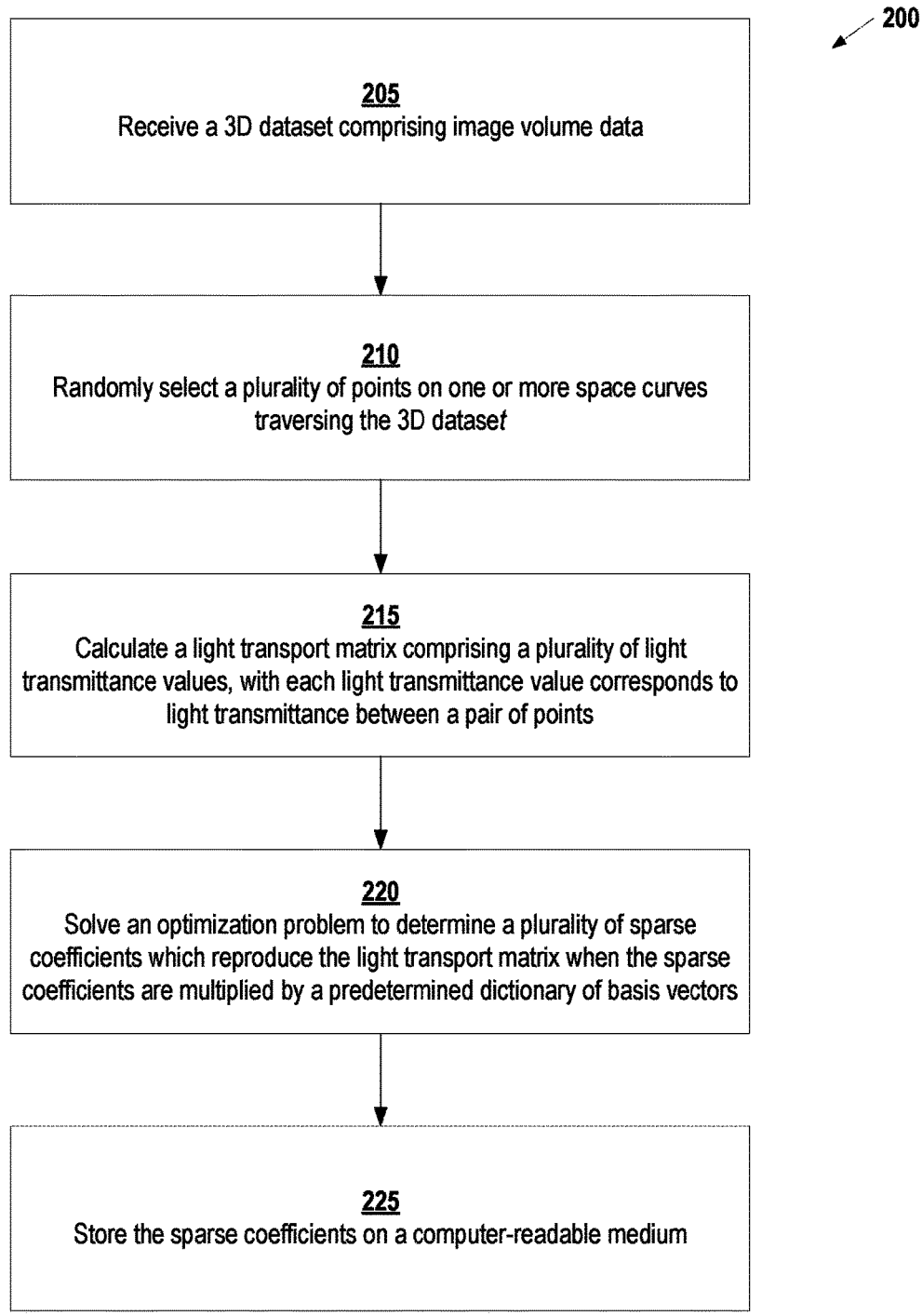
FIG. 2 provides an illustration of a method for calculating light transport matrix, according to some embodiments.

FIG. 2 provides an illustration of a method 200 for calculating light transport matrix, according to some embodiments. This method 200 may generally be performed by any computational platform comprising one or more processors; however, for computational efficiency, a parallel processing architecture is generally preferred. One example of such architecture is described below with respect to FIG. 3.

Starting at step 205, a 3D dataset comprising image volume data is received by the computational platform performing the method. For example, the image volume data may be explicitly uploaded to the computational platform or the computation platform may be provided with a file name or other indicator (e.g., via a graphical user interface) that is then used to retrieve the image volume data from a local or remote computer readable medium. In some embodiments, the computational platform is either integrated within or directly connected to the device used to acquire the image volume data. For example, in one embodiment, the image volume data comprises medical imaging data and the computational platform is part of a medical image scanner (e.g., magnetic resonance scanner or computed tomography scanner).

Continuing with reference to FIG. 2, at step 210, a plurality of points is randomly selected on one or more space curves traversing the 3D dataset. The term space curve, as used herein, is a curve that passes through a region of three-dimensional space. A space curve is the 3D analog to a plane curve which resides in a single 2D plane. Examples of space curves include, without limitation, a helix, a conical helix, and a cubical parabola; however, it should be noted that generally any curve traversing three dimensions may be considered a space curve. The exact mathematical representation for a space curve varies according to the desired shape and other characteristics of the curve. For example, a helix can be generated using the following values: $x=r*\cos(t)$, $y=r*\sin(t)$, and $z=bt$ where r, $b \cdot 0$, $-\infty \le t \le \infty$. In some embodiments, the space curve is selected based on a priori knowledge of the physical objects depicted in the underlying image data. For example, if any anatomical object of interest (e.g., the heart) is known to be located in a particular region of the image volume, a space curve may be selected that provides multiple traversals of the region. Note that, because the light transport matrix needs to consider lighting effects from multiple directions, the selected space curve should be selected such that it provides coverage even at regions of the image volume that do not include voxels with the object of interest. In some embodiments, the space curve preserves locality of values in the 3D dataset. For example, the space curve may be a Hilbert space-filling curve or a plurality of Z-order curve iterations.

In general any technique known in the art may be used to perform the random sampling of the points on the space curve. In some embodiments, the random sampling is performed over the entire space curve. In other embodiments, the space curve may be divided into segments and each segment may be sampled differently. For example, based on a priori knowledge of the objects in image volume, segments of the space curve passing through regions of the volume known to have more substantial luminance effects may be sampled more densely than those segments that have little or no effect. In some embodiments, the random sampling samples a predetermined percentage of the 3D dataset. For example, a user may specify that 5% of the image volume should be used and the sampling may be performed accordingly. In some embodiments, rather than specify value, the predetermined percentage may be determined at runtime based on factors such as the computational resources available for processing the image volume or the density of data in the image volume.

At step 215 of FIG. 2, the light transport matrix is calculated. The predetermined percentage comprises a plurality of light transmittance values. Each light transmittance value corresponds to light transmittance between a pair of points included in the points sampled at step 210. As is generally understood, in the radiant energy incident a particular point can be defined by the linear equation $i=T_p$. In this equation, p is a vector comprising the radiant energy emitted by one or more light sources and i is a vector comprising the energy incident at one or more locations. The matrix T is the light transport matrix where each element indicates the fraction of energy at a particular point. Thus, element T[m,n] of the light transport matrix is populated with a unit-less value that describes the fraction of radiant energy transmitted by source n that reaches location m. The value of T[m,n] is the solution of the integral $\int_{\Omega_{m,n}} f(x) d\mu(x)$, where f(x) is the scattering throughput function that represents the radiant energy carried along path x, $\Omega_{m,n}$ is the space of light paths connecting source n to point m and $\mu(x)$ is the corresponding measure on the space of the light paths. Techniques for solving this integral are generally known in the art, and thus such techniques are not described in detail herein.

In some embodiments, the process of calculating the light transport matrix may be further refined to reduce the number of data points that need to be stored. For example, in one embodiment, pairs on the points separated by greater than a predetermined distance (e.g., 75% the size of the volume) may be excluded. Thus, the light transport matrix would be populated only with light transmittance values for pairs of points in the subset of all available pairs of points. In other embodiments, the image volume data comprises anatomical objects and anatomical features are identified between each pair of points included in the randomly selected plurality of points on the space curve. The anatomical features may be identified, for example, by applying a trained machine learning model to the 3D dataset or by applying an image mask that masks voxels of the image volume corresponding to the anatomical features having light absorption coefficient values above or below a predetermined threshold value. Next, light absorption coefficient values may be determined for each of the anatomical features. Then, the light transport matrix may be populated only with light transmittance values for pairs of points not separated by one or more anatomical features having light attenuation values above a predetermined threshold value (e.g., determined based on the material properties and thickness of the anatomical features).

Returning to FIG. 2, at step 220, an optimization problem is solved to determine a plurality of sparse coefficients which reproduce the light transport matrix when the sparse coefficients are multiplied by a predetermined dictionary of basis vectors. The vectors are sparse in some known basis (e.g. Fourier basis, wavelet basis, etc.). As would be understood by one skilled in the art, sparse coding allows a signal x to be represented as a linear combination of a plurality of basis vectors in the dictionary $\Phi=[(\phi_1 \ldots \phi_k)] \lceil R^{n \times k}$. More generally, the signal may be represented by the equation:

$$x = \Phi\alpha + \varepsilon,$$

where $\alpha$ are the coefficients of the basis and $\varepsilon$ represents the noise. Given $\Phi$ and a dataset $X=\{x_i\}_{i=1}^{N}$, the solution of a may be formulated as a sparse coding product with the $l_1$ regularization as shown in the following optimization problem:

$$\alpha^* = \arg_\alpha \min \|\alpha\|_1, \text{ s.t.} \sum_{i=1}^{N} \|x_i - \Phi\alpha_i\|^2 \le \varepsilon.$$

In the context of method shown in FIG. 2, $\alpha^*$ represents the plurality of sparse coefficients which reproduce the light transport matrix. The equation for $\alpha^*$ is solved using an optimization strategy. Various optimization strategies generally known in the art may be applied to the learning task. For example, in some embodiments, greedy strategy approximations (e.g., matching pursuit algorithms) are applied. In other embodiments, the dictionary is learned a constrained optimization strategy such as the alternating direction method (ADM) sparse representation strategy. In other embodiments, a proximity algorithm applies a proximal operator to iteratively solve the optimization problem. Examples of proximity-based algorithms include Iterative Shrinkage Thresholding Algorithm (ISTA) and the Fast Iterative Shrinkage Algorithm (FISTA), and Sparse Reconstruction by Separable Approximation (SpaRSA).

Lastly, at step 225, the sparse coefficients are stored on a local or remote computer-readable medium. The sparse coefficients may later be used displaying the image volume data with illumination. For example, in response to receiving a request to display the image volume data with illumination, the sparse coefficients may first be retrieved from the computer-readable medium. Next, either the individual elements of the light transport matrix (T[m,n]) or the complete light transport matrix (T) can be reconstructed by applying the sparse coefficients to the predetermined dictionary of basis vectors. Then the image volume data may be displayed with illumination, as determined using the light transport matrix.

Figure 3:
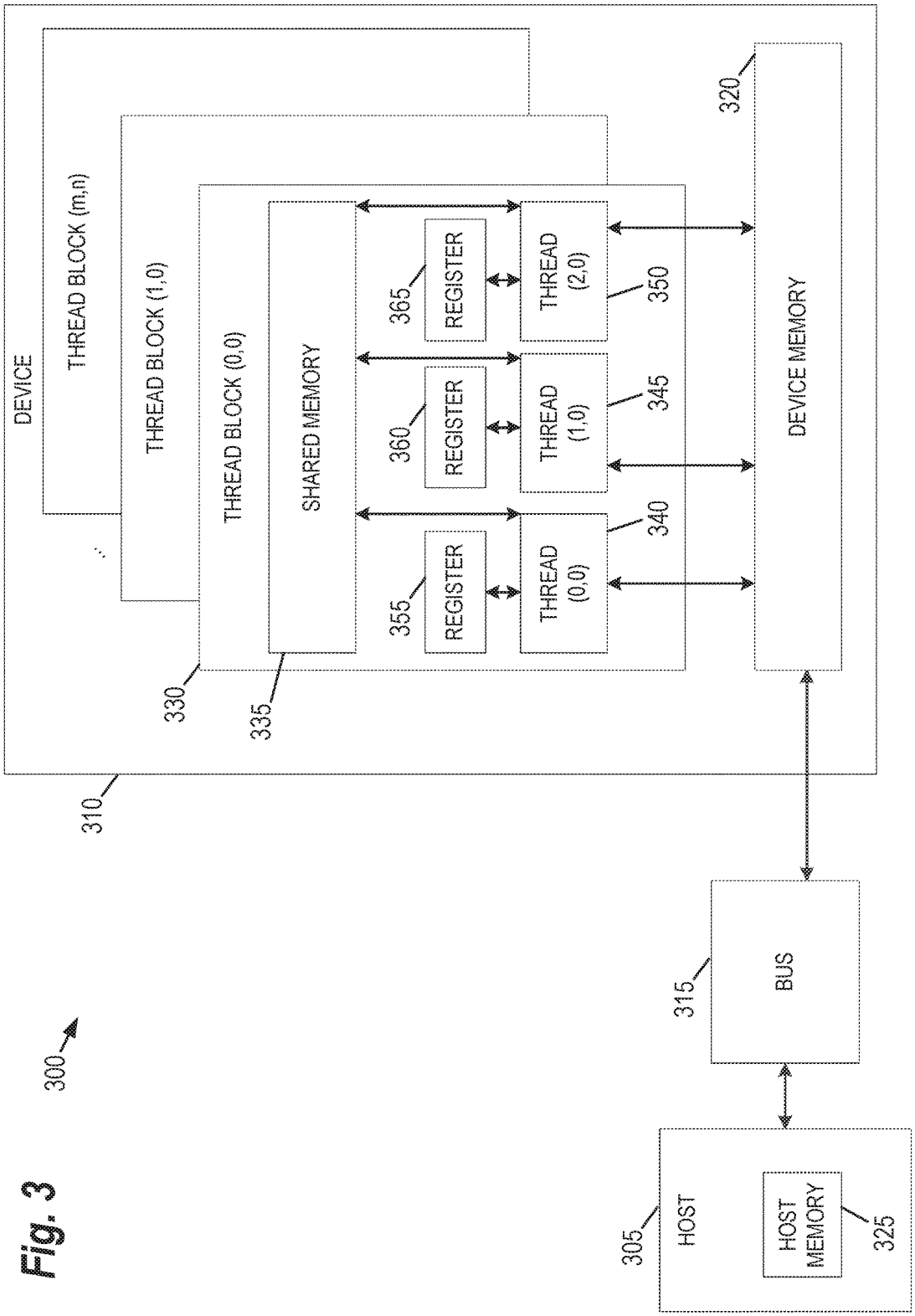
FIG. 3 provides an example of a parallel processing memory architecture that may be utilized to perform computations related to calculating a light transport matrix, according to some embodiments of the present invention.

FIG. 3 provides an example of a parallel processing memory architecture 300 that may be utilized to perform computations related to calculation of the light scale matrix, according to some embodiments of the present invention. Such architectures are useful because of their extensive computational power and ability to solve large-scale optimization problems. This architecture 300 may be used in embodiments of the present invention where NVIDIA™ CUDA (or a similar parallel computing platform) is used. The architecture includes a host computing unit ("host") 305 and a GPU device ("device") 310 connected via a bus 315 (e.g., a PCIe bus). The host 305 includes the central processing unit, or "CPU" (not shown in FIG. 3) and host memory 325 accessible to the CPU. The device 310 includes the graphics processing unit (GPU) and its associated memory 320, referred to herein as device memory. The device memory 320 may include various types of memory, each optimized for different memory usages. For example, in some embodiments, the device memory includes global memory, constant memory, and texture memory.

Parallel portions of the application that calculates the light transport matrix may be executed on the architecture 300 as "device kernels" or simply "kernels." A kernel comprises parameterized code configured to perform a particular function. The parallel computing platform is configured to execute these kernels in an optimal manner across the architecture 300 based on parameters, settings, and other selections provided by the user. Additionally, in some embodiments, the parallel computing platform may include additional functionality to allow for automatic processing of kernels in an optimal manner with minimal input provided by the user.

The processing required for each kernel is performed by a grid of thread blocks (described in greater detail below). Using concurrent kernel execution, streams, and synchronization with lightweight events, the architecture 300 of FIG. 3 (or similar architectures) may be used to parallelize the optimization function such that various operations performed with solving the system are done in parallel. For example, for CUDA architectures, libraries such as cuBLAS may be used to parallelize calculations involving the basis vectors in the dictionary and the cuSPARSE library may be used for parallelizing the optimization algorithm and other sparse operations involved with calculating the sparse coefficients.

The device 310 includes one or more thread blocks 330 which represent the computation unit of the device 310. The term thread block refers to a group of threads that can cooperate via shared memory and synchronize their execution to coordinate memory accesses. For example, in FIG. 3, threads 340, 345 and 350 operate in thread block 330 and access shared memory 335. Depending on the parallel computing platform used, thread blocks may be organized in a grid structure. A computation or series of computations may then be mapped onto this grid. For example, in embodiments utilizing CUDA, computations may be mapped on one-, two-, or three-dimensional grids. Each grid contains multiple thread blocks, and each thread block contains multiple threads. For example, in FIG. 3, the thread blocks 330 are organized in a two dimensional grid structure with m+1 rows and n+1 columns. Generally, threads in different thread blocks of the same grid cannot communicate or synchronize with each other. However, thread blocks in the same grid can run on the same multiprocessor within the GPU at the same time. The number of threads in each thread block may be limited by hardware or software constraints. In some embodiments, light transport calculations may be automatically partitioned over thread blocks automatically by the parallel computing platform software (e.g., using cuBLAS or cuSPARSE); while, in other embodiments, a user may programmatically specify the partitioning.

Continuing with reference to FIG. 3, registers 355, 360, and 365 represent the fast memory available to thread block 330. Each register is only accessible by a single thread. Thus, for example, register 355 may only be accessed by thread 340. Conversely, shared memory is allocated per thread block, so all threads in the block have access to the same shared memory. Thus, shared memory 335 is designed to be accessed, in parallel, by each thread 340, 345, and 350 in thread block 330. Threads can access data in shared memory 335 loaded from device memory 320 by other threads within the same thread block (e.g., thread block 330). The device memory 320 is accessed by all blocks of the grid and may be implemented using, for example, Dynamic Random-Access Memory (DRAM).

Each thread can have one or more levels of memory access. For example, in the architecture 300 of FIG. 3, each thread may have three levels of memory access. First, each thread 340, 345, 350, can read and write to its corresponding registers 355, 360, and 365. Registers provide the fastest memory access to threads because there are no synchronization issues and the register is generally located close to a multiprocessor executing the thread. Second, each thread 340, 345, 350 in thread block 330, may read and write data to the shared memory 335 corresponding to that thread block 330. Generally, the time required for a thread to access shared memory exceeds that of register access due to the need to synchronize access among all the threads in the thread block. However, like the registers in the thread block, the shared memory is typically located close to the multiprocessor executing the threads. The third level of memory access allows all threads on the device 310 to read and/or write to the device memory. Device memory requires the longest time to access because access must be synchronized across the thread blocks operating on the device. Thus, in some embodiments, the calculation of each pair of points in the light transport matrix is coded such that it primarily utilizes registers and shared memory and only utilizes device memory as necessary to move data in and out of a thread block.

The embodiments of the present disclosure may be implemented with any combination of hardware and software. For example, aside from parallel processing architecture presented in FIG. 3, standard computing platforms (e.g., servers, desktop computer, etc.) may be specially configured to perform the techniques discussed herein. In addition, the embodiments of the present disclosure may be included in an article of manufacture (e.g., one or more computer program products) having, for example, computer-readable, non-transitory media. The media may have embodied therein computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only.

Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U. S. C. 112 (f) unless the element is expressly recited using the phrase "means for."

I claim:

1. A computer-implemented method for performing compressive sensing of light transport matrix, the method comprising:
receiving a 3D dataset comprising image volume data comprising anatomical objects;
randomly selecting a plurality of points on a space curve traversing the 3D dataset;
calculating a light transport matrix comprising a plurality of light transmittance values, wherein each light transmittance value corresponds to light transmittance between a pair of points included in the plurality of points;
wherein calculation of the light transport matrix comprises:
identifying anatomical features between each pair of points included in the randomly selected plurality of points on the space curve;
determining light attenuation values for each of the anatomical features;
populating the light transport matrix only with light transmittance values for pairs of points not separated by one or more anatomical features having light attenuation values above a predetermined threshold value;
solving an optimization problem to determine a plurality of sparse coefficients which reproduce the light transport matrix when the sparse coefficients are multiplied by a predetermined dictionary of basis vectors; and
storing the sparse coefficients on a computer-readable medium.

2. The method of claim 1, further comprising:
receiving a request to display the image volume data with illumination;
retrieving the sparse coefficients from the computer-readable medium;
reconstruct the light transport matrix using the sparse coefficients and the predetermined dictionary of basis vectors; and
displaying the image volume data with illumination using the light transport matrix.

3. The method of claim 1, wherein the space curve preserves locality of values in the 3D dataset.

4. The method of claim 3, wherein the space curve is a Hilbert space-filling curve.

5. The method of claim 3, wherein the space curve comprises a plurality of Z-order curve iterations.

6. The method of claim 1, wherein the random sampling of the plurality of points on the space curve samples a predetermined percentage of the 3D dataset.

7. The method of claim 1, wherein calculation of the light transport matrix comprises:
identifying a subset of all available pairs of points included in the randomly selected plurality of points on the space curve, wherein each pair of points in the subset comprises two points located within a predetermined distance within the 3D dataset; and populating the light transport matrix only with light transmittance values for pairs of points in the subset of all available pairs of points.

8. The method of claim 1, wherein the anatomical features are identified by applying a trained learning model to the 3D dataset.

9. The method of claim 1, wherein the anatomical features are identified by applying an image mask that masks voxels of the image volume data corresponding to the one or more anatomical features having light attenuation values above the predetermined threshold value.

10. The method of claim 1, wherein the optimization problem is solved by performing a plurality of mathematical operations in parallel using a plurality of graphical processing units.

11. An article of manufacture for performing compressive sensing of light transport matrix, the article of manufacture comprising a computer-readable, non-transitory medium holding computer-executable instructions for performing a method comprising:
  receive a 3D dataset comprising image volume data comprising anatomical objects;
  randomly selecting a plurality of points on a space curve traversing the 3D dataset;
  calculating a light transport matrix comprising a plurality of light transmittance values, wherein each light transmittance value corresponds to light transmittance between a pair of points included in the plurality of points;
  wherein calculation of the light transport matrix comprises:
    identifying anatomical features between each pair of points included in the randomly selected plurality of points on the space curve;
    determining light attenuation values for each of the anatomical features;
    populating the light transport matrix only with light transmittance values for pairs of points not separated by one or more anatomical features having light attenuation values above a predetermined threshold value;
  solving an optimization problem to determine a plurality of sparse coefficients which reproduce the light transport matrix when the sparse coefficients are multiplied by a predetermined dictionary of basis vectors; and
  storing the sparse coefficients on a computer-readable medium.

12. The article of manufacture of claim 11, wherein the method further comprises:
  receiving a request to display the image volume data with illumination;
  retrieving the sparse coefficients from the computer-readable medium;
  reconstruct the light transport matrix using the sparse coefficients and the predetermined dictionary of basis vectors; and
  displaying the image volume data with illumination using the light transport matrix.

13. The article of manufacture of claim 11, wherein the space curve preserves locality of values in the 3D dataset.

14. The article of manufacture of claim 11, wherein calculation of the light transport matrix comprises:
  identifying a subset of all available pairs of points included in the randomly selected plurality of points on the space curve, wherein each pair of points in the subset comprises two points located within a predetermined distance within the 3D dataset; and
  populating the light transport matrix only with light transmittance values for pairs of points in the subset of all available pairs of points.

15. The article of manufacture of claim 11, wherein the anatomical features are identified by applying a trained learning model to the 3D dataset.

16. The article of manufacture of claim 11, wherein the anatomical features are identified by applying an image mask that masks voxels of the image volume data corresponding to the one or more anatomical features having light attenuation values above the predetermined threshold value.

17. A system for performing compressive sensing of light transport matrix, the system comprising:
  an image acquisition device configured to acquire a 3D dataset comprising image volume data comprising anatomical objects;
  a parallel processing memory architecture comprising a plurality of processors configured to:
    randomly select a plurality of points on a space curve traversing the 3D dataset;
    calculate a light transport matrix comprising a plurality of light transmittance values, wherein each light transmittance value corresponds to light transmittance between a pair of points included in the plurality of points;
    wherein calculation of the light transport matrix comprises:
      identifying anatomical features between each pair of points included in the randomly selected plurality of points on the space curve;
      determining light attenuation values for each of the anatomical features;
      populating the light transport matrix only with light transmittance values for pairs of points not separated by one or more anatomical features having light attenuation values above a predetermined threshold value;
    solve an optimization problem to determine a plurality of sparse coefficients which reproduce the light transport matrix when the sparse coefficients are multiplied by a predetermined dictionary of basis vectors; and
  a non-transitory computer-readable medium configures to store the sparse coefficients.

* * * * *